United States Patent
Isoda et al.

(10) Patent No.: US 11,161,788 B2
(45) Date of Patent: Nov. 2, 2021

(54) CORDIERITE-BASED SINTERED BODY, METHOD FOR PRODUCING THE SAME, AND COMPOSITE SUBSTRATE

(71) Applicant: NGK INSULATORS, LTD., Nagoya (JP)

(72) Inventors: Yoshinori Isoda, Ichinomiya (JP); Yoshio Suzuki, Nagoya (JP); Katsuhiro Inoue, Ama-Gun (JP); Yuji Katsuda, Tsushima (JP)

(73) Assignee: NGK Insulators, Ltd., Nagoya (JP)

( * ) Notice: Subject to any disclaimer, the term of this patent is extended or adjusted under 35 U.S.C. 154(b) by 428 days.

(21) Appl. No.: 15/463,251

(22) Filed: Mar. 20, 2017

(65) Prior Publication Data
US 2017/0275207 A1 Sep. 28, 2017

(30) Foreign Application Priority Data

Mar. 23, 2016 (JP) ............................. JP2016-058969
Feb. 24, 2017 (JP) ............................. JP2017-033437

(51) Int. Cl.
*C04B 35/195* (2006.01)
*C04B 35/626* (2006.01)
(Continued)

(52) U.S. Cl.
CPC ...... *C04B 35/195* (2013.01); *C04B 35/62605* (2013.01); *C04B 35/62675* (2013.01); *C04B 35/645* (2013.01); *C04B 35/6455* (2013.01); *C04B 37/00* (2013.01); *H01L 41/00* (2013.01); *C04B 2235/3206* (2013.01); *C04B 2235/3481* (2013.01); *C04B 2235/3873* (2013.01); *C04B 2235/5436* (2013.01); *C04B 2235/5445* (2013.01); *C04B 2235/604* (2013.01);
(Continued)

(58) Field of Classification Search
CPC .............................. H01L 41/08; C04B 32/195
See application file for complete search history.

(56) References Cited

U.S. PATENT DOCUMENTS 5,634,999 A * 6/1997 Takeuchi .............. G01L 9/0042
156/89.11
6,265,334 B1 * 7/2001 Sechi ...................... C04B 35/195
257/E23.009
(Continued)

FOREIGN PATENT DOCUMENTS

EP 0 152 481 B1 9/1988
JP 2003-197725 A 7/2003
(Continued)

OTHER PUBLICATIONS

Webmineral, "Cordierite Mineral Data", p. 1-3; Accessed on Oct. 23, 2019 at www.webmineral.com/data/Cordierite.shtml.*
(Continued)

*Primary Examiner* — Mark Ruthkosky
*Assistant Examiner* — Julia L Rummel
(74) *Attorney, Agent, or Firm* — Burr & Brown, PLLC

(57) ABSTRACT

A cordierite-based sintered body according to the present invention contains cordierite as a main component and silicon nitride or silicon carbide. The cordierite-based sintered body preferably has a thermal expansion coefficient less than 2.4 ppm/° C. at 40° C. to 400° C., an open porosity of 0.5% or less, and an average grain size of 1 μm or less.

5 Claims, 3 Drawing Sheets

(51) Int. Cl.
*C04B 35/645* (2006.01)
*H01L 41/00* (2013.01)
*C04B 37/00* (2006.01)

(52) U.S. Cl.
CPC ............ *C04B 2235/656* (2013.01); *C04B 2235/6562* (2013.01); *C04B 2235/6567* (2013.01); *C04B 2235/74* (2013.01); *C04B 2235/76* (2013.01); *C04B 2235/77* (2013.01); *C04B 2235/785* (2013.01); *C04B 2235/786* (2013.01); *C04B 2235/80* (2013.01); *C04B 2235/96* (2013.01); *C04B 2235/963* (2013.01); *C04B 2235/9607* (2013.01); *C04B 2237/341* (2013.01); *C04B 2237/704* (2013.01); *Y10T 428/249956* (2015.04); *Y10T 428/249967* (2015.04); *Y10T 428/249986* (2015.04)

(56) References Cited

U.S. PATENT DOCUMENTS

| | | | | |
|---|---|---|---|---|
| 7,229,940 | B2* | 6/2007 | Teratani | C04B 35/195 |
| | | | | 501/118 |
| 2003/0044653 | A1* | 3/2003 | Hiramatsu | H05B 3/143 |
| | | | | 428/704 |
| 2003/0100434 | A1* | 5/2003 | Yoshitomi | B82Y 30/00 |
| | | | | 501/87 |
| 2005/0152089 | A1* | 7/2005 | Matsuda | H02N 13/00 |
| | | | | 361/234 |
| 2005/0215417 | A1 | 9/2005 | Teratani et al. | |
| 2007/0024313 | A1* | 2/2007 | Itakura | G01R 31/2893 |
| | | | | 324/755.01 |
| 2010/0039747 | A1* | 2/2010 | Sansoni | H01L 21/6833 |
| | | | | 361/234 |
| 2016/0264471 | A1 | 9/2016 | Isoda et al. | |

FOREIGN PATENT DOCUMENTS

| | | | |
|---|---|---|---|
| JP | 3574560 B2 | 10/2004 | |
| JP | 2005-314215 A | 11/2005 | |
| JP | 4416191 B2 | 2/2010 | |
| JP | 5890945 B1 | 3/2016 | |
| WO | WO-0224600 A1 * | 3/2002 | ............ B82Y 30/00 |
| WO | 2015/186571 A1 | 12/2015 | |

OTHER PUBLICATIONS

Ceramtec, "Non-oxide Ceramics-Silicon Nitride (Si3N4) The Ceramic for Extreme Applications", p. 1-2; Accessed on Oct. 23, 2019 at https://www.ceramtec.com/ceramic-materials/silicon-nitride/.*
German Office Action (Application No. 10 2017 002 735.8) dated Feb. 27, 2019 (with English translation).
Taiwanese Office Action, Taiwanese Application No. 20170109503, dated Aug. 12, 2020 (5 pages).
Chinese Office Action, Chinese Application No. 201710172464.4, dated Dec. 3, 2020 (9 pages).
Japanese Office Action (with English translation), Japanese Application No. 2017-033437, dated Mar. 23, 2021 (7 pages).
N. M. Khalil et al., "In-situ Cordierite-Silicon Carbide Composite, "American Ceramic Society Bulletin, Jul. 2009, vol. 87, No. 7, 9201-9207.
Korean Office Action (Application No. 10-2017-0033839) dated Aug. 24, 2021 (with English translation).

* cited by examiner

Binarization

CORDIERITE-BASED SINTERED BODY, METHOD FOR PRODUCING THE SAME, AND COMPOSITE SUBSTRATE

BACKGROUND OF THE INVENTION

1. Field of the Invention

The present invention relates to a cordierite-based sintered body, a method for producing the cordierite-based sintered body, and a composite substrate.

2. Description of the Related Art

Cordierite is a material having high heat resistance and a low thermal expansion coefficient and thus is known as a material that has high thermal shock resistance. To improve the mechanical properties of cordierite, silicon nitride or silicon carbide having a high Young's modulus and high strength are also known to be added to cordierite (PTLs 1 and 2). In PTL 1, a cordierite-based sintered body having a relative density of 97% to 98% is produced by adding a rare-earth oxide and silicon nitride or silicon carbide to cordierite having an average particle diameter of 1.2 μm and firing the mixture in air. In PTL 2, a cordierite-based sintered body having a high Young's modulus is produced by adding silicon nitride or silicon carbide having an average particle diameter of 1 μm to cordierite having a particle diameter of 3 μm and firing the mixture in a nitrogen atmosphere at normal pressure.

PTL 3 discloses an example in which a composite substrate including a functional substrate directly bonded to a support substrate, the functional substrate being composed of lithium tantalate, lithium niobate, or the like, and the support substrate being composed of a cordierite-based sintered body, is used for an acoustic wave device such as a surface acoustic wave element. In the acoustic wave device, the dependence of frequency on temperature is significantly improved because the cordierite-based sintered body serving as the support substrate has a very small thermal expansion coefficient of about 1.1 ppm/° C. (40° C. to 400° C.)

CITATION LIST

Patent Literature

PTL 1: JP 3574560 B
PTL 2: JP 4416191 B
PTL 3: WO 2015/186571 A1

SUMMARY OF THE INVENTION

When the functional substrate and the support substrate are bonded together as in PTL 3, both substrates need to have a high degree of surface flatness. However, because the cordierite-based sintered body described in PTL 1 has a low relative density of 97% to 98% and a porosity of several percent, even if a surface of the sintered body is subjected to polish finishing, a high degree of flatness is not obtained. In the cordierite-based sintered body described in PTL 2, because of the raw-material cordierite particles having a large particle diameter of 3 μm and the addition of a sintering aid, the size of the sintered grains is larger than the raw-material cordierite particles. Thus, a high degree of flatness is not obtained even if polish finishing is performed. When such a cordierite-based sintered body is used for an acoustic wave device, the size of the sintered grains can be larger than an interelectrode distance. In this case, variations in the acoustic velocity of the composite substrate can occur to cause variations in device characteristics.

The present invention has been accomplished to solve these problems and mainly aims to provide a cordierite-based sintered body having high stiffness with the low thermal expansion coefficient of cordierite maintained and a high degree of flatness of a polished surface of the cordierite-based sintered body.

A cordierite-based sintered body according to the present invention contains cordierite as a main component and silicon nitride or silicon carbide and has a thermal expansion coefficient less than 2.4 ppm/° C. at 40° C. to 400° C., an open porosity of 0.5% or less, and an average grain size (average grain size of sintered grains) of 1 μm or less. The cordierite-based sintered body has high stiffness with the low thermal expansion coefficient of cordierite maintained and a high degree of flatness of a polished surface thereof.

A method for producing a cordierite-based sintered body according to the present invention includes the steps of (a) preparing a raw-material powder mixture by mixing 60% to 90% by volume of a cordierite powder having an average particle diameter of 0.1 to 1 μm and 10% to 40% by volume of a silicon nitride powder having an average particle diameter of 0.1 to 1 μm in a total amount of 100% by volume or by mixing 70% to 90% by volume of a cordierite powder having an average particle diameter of 0.1 to 1 μm and 10% to 30% by volume of a silicon carbide powder having an average particle diameter of 0.1 to 1 μm in a total amount of 100% by volume; and (b) producing a cordierite-based sintered body by forming the raw material powder mixture into a compact having a predetermined form and subjecting the compact to hot pressing at a pressing pressure of 20 to 300 kgf/cm$^2$ and a firing temperature of 1350° C. to 1450° C. (maximum temperature). This production method is suited to produce the foregoing cordierite-based sintered body according to the present invention. The average particle diameter of each of the powders is a value measured by laser diffractometry (the same applies hereinafter).

A composite substrate according to the present invention includes a functional substrate and a support substrate bonded to the functional substrate, the support substrate being composed of the foregoing cordierite-based sintered body. In the composite substrate, because of a high degree of flatness of a polished surface of the cordierite-based sintered body serving as the support substrate, satisfactory bonding to the functional substrate is achieved. When the composite substrate is used for a surface acoustic wave device, the dependence of frequency on temperature is significantly improved. For an optical waveguide device, an LED device, and a switching device, because of a small thermal expansion coefficient of the support substrate, the performance is improved.

DETAILED DESCRIPTION OF THE INVENTION

Figure 1:
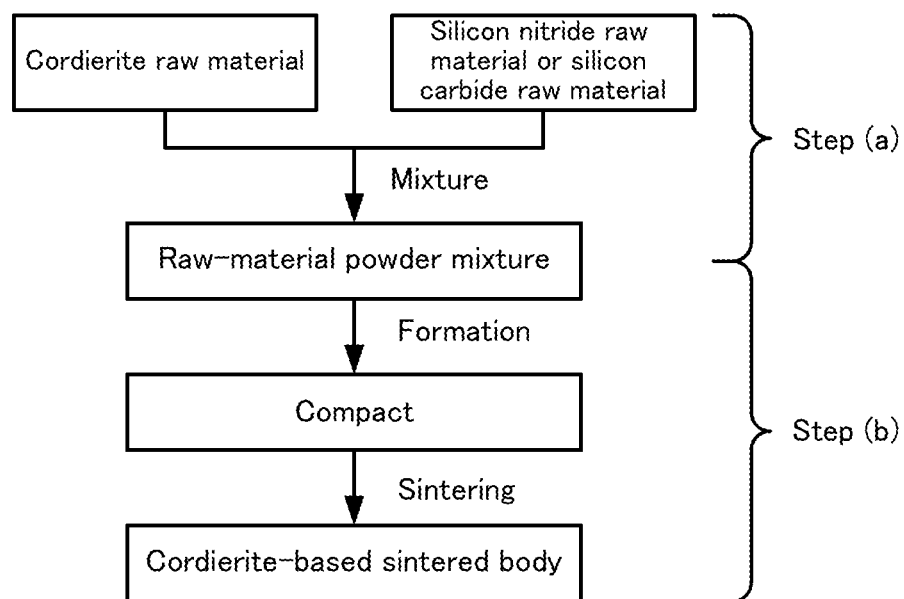
FIG. 1 illustrates steps in the production of a cordierite-based sintered body.

It should be understood that while embodiments of the present invention will be specifically described below, the present invention is not limited to the following embodiments, and appropriate modifications and variations can be made without departing from the spirit of the present invention on the basis of the general knowledge of one skilled in the art.

The cordierite-based sintered body of this embodiment contains cordierite as a main component and silicon nitride or silicon carbide. The term "main component" refers to a component that accounts for the largest volume of the sintered body. The cordierite-based sintered body preferably has a thermal expansion coefficient less than 2.4 ppm/° C. at 40° C. to 400° C., an open porosity of 0.5% or less, and an average grain size of 1 µm or less. Although the cordierite-based sintered body contains silicon nitride or silicon carbide having a higher thermal expansion coefficient than cordierite, the cordierite-based sintered body maintains a low thermal expansion coefficient. The cordierite-based sintered body contains silicon nitride or silicon carbide having a higher Young's modulus than cordierite and thus has high stiffness, compared with cordierite alone. Because the cordierite-based sintered body has an open porosity of 0.5% or less, few pores, and a small average grain size of 1 µm or less, a surface that has been subjected to polish finishing (polished surface) has a high degree of flatness.

In the cordierite-based sintered body of the present embodiment, the number of pores having a maximum length of 1 µm or more and being present in a polished surface having an area of 100 µm×100 µm is preferably 10 or less. When the number of pores is 10 or less, the surface that has been subjected to polish finishing has a higher degree of flatness. The number of pores is preferably three or less and more preferably zero.

The cordierite-based sintered body of the present embodiment preferably has a Young's modulus of 160 GPa or More and preferably has a four-point flexural strength of 220 MPa or more. Because silicon nitride and silicon carbide have a higher Young's modulus and strength than cordierite, the cordierite-based sintered body can have a Young's modulus of 160 GPa or more and a four-point flexural strength of 220 MPa or more by adjusting the proportion of silicon nitride or silicon carbide to cordierite.

In the cordierite-based sintered body of the present embodiment, a polished surface preferably has a center-line average roughness Ra of 1.5 nm or less. A composite substrate in which a functional substrate is bonded to a support substrate is known as a composite substrate used for an acoustic wave device. When the cordierite-based sintered body having a polished surface with a center-line average roughness Ra of 1.5 nm or less as described above is used as the support substrate, satisfactory bondability is obtained between the support substrate and the functional substrate. For example, the area percentage of an actually bonded portion of a bonded interface (bonding area percentage) is 80% or more (preferably 90% or more). The center-line average roughness Ra of the polished surface is preferably 1.1 nm or less, more preferably 1.0 nm or less, and particularly preferably 0.8 nm or less.

The cordierite-based sintered body of the present embodiment more preferably has a thermal expansion coefficient of 2.0 ppm/° C. or less at 40° C. to 400° C. In the case where a composite substrate including the cordierite-based sintered body serving as a support substrate is used for an acoustic wave device, the dependence of the frequency of the acoustic wave device on temperature is improved because the amount of the thermal expansion of the functional substrate is smaller than the original amount of the thermal expansion when the temperature of the acoustic wave device rises. The thermal expansion coefficient is more preferably 1.8 ppm/° C. or less at 40° C. to 400° C.

When the cordierite-based sintered body of the present embodiment contains silicon nitride, preferably, a cordierite phase is 60% to 90% by volume, and a silicon nitride phase is 10% to 40% by volume. When the cordierite-based sintered body of the present embodiment contains silicon carbide, preferably, the cordierite phase is 70% to 90% by volume, and a silicon carbide phase is 10% to 30% by volume. The composition ratio is preferred because the properties, such as the number of pores, the Young's modulus, the center-line average roughness Ra, and the thermal expansion coefficient at 40° C. to 400° C., are satisfactory. The % by volume of each phase is determined as follows: A polished surface of the cordierite-based sintered body of the present embodiment is subjected to observation of a back-scattered electron image and a composition analysis with an SEM. The area ratio of the phases determined from a contrast ratio of the image is converted to a volume ratio (% by volume) of the phases of the sintered body.

An embodiment of a method for producing a cordierite-based sintered body according to the present invention will be described below. As illustrated in FIG. 1, a procedure for producing a cordierite-based sintered body includes the steps of (a) preparing a raw-material powder mixture and (b) producing a cordierite-based sintered body.

Step (a): Preparation of Raw-Material Powder Mixture

As a cordierite raw material, a powder having high purity and a small average particle diameter is preferably used. The purity is preferably 99.0% or more, more preferably 99.5% or more, and still more preferably 99.8% or more. The units of purity are % by mass. The average particle diameter (D50) is preferably 1 µm or less and more preferably 0.1 to 1 µm. As the cordierite raw material, a commercial item or a material prepared from high-purity magnesia, alumina, and silica powders may be used. An example of a method for preparing a cordierite raw material is a method described in PTL 3. As a silicon nitride raw material and a silicon carbide raw material, powders having a small average particle diameter are preferably used. The average particle diameter is preferably 1 µm or less and More preferably 0.1 to 1 µm. In the case where a raw-material powder mixture of the cordierite raw material and the silicon nitride raw material is prepared, for example, the raw-material powder mixture may be prepared by weighing 60% to 90% by volume of the cordierite raw material and 10% to 40% by volume of the silicon nitride raw material in a total amount of 100% by volume, performing mixing with a mixer such as a pot mill, and if necessary, performing drying with a spray dryer. In the case where a raw-material powder mixture of the cordierite raw material and the silicon carbide raw material is prepared, for example, the raw-material powder mixture may be prepared by weighing 70% to 90% by volume of the cordierite raw material and 10% to 30% by volume of the silicon carbide raw material in a total amount of 100% by volume, performing mixing with a mixer such as a pot mill, and if necessary, performing drying with a spray dryer.

Step (b): Production of Cordierite-Based Sintered Body

The raw-material powder mixture prepared in the step (a) is formed into a compact having a predetermined form. A formation method is not particularly limited, and a common formation method may be employed. For example, the raw-material powder mixture may be directly press-formed with a die. In the case of press forming, when the raw-material powder mixture is spray dried into granules, satisfactory formability is obtained. A green body or slurry prepared by the addition of an organic binder may be subjected to extrusion molding or sheet forming. In these processes, the organic binder component needs to be removed before or during a firing step. High-pressure molding may be performed by cold isostatic pressing (CIP).

The resulting compact is fired to form a cordierite-based sintered body. At this time, maintaining fine sintered grains and eliminating pores during firing are preferred to improve the degree of surface flatness of the cordierite-based sintered body. As a method therefor, a hot-pressing method is very effective. The use of the hot-pressing method allows densification to proceed with a fine grain state maintained at a lower temperature than that in pressureless sintering and suppresses the formation of coarse pores, which are often observed in pressureless sintering. The firing temperature in the hot pressing is preferably 1350° C. to 1450° C. and more preferably 1375° C. to 1425° C. The pressing pressure in the hot pressing is preferably 20 to 300 kgf/cm$^2$. In particular, a lower pressing pressure results in a hot-pressing jig having a smaller size and a longer life and thus is preferred. The holding time at the firing temperature (maximum temperature) may be appropriately selected in view of the form and the size of the formed body, the characteristics of a heating furnace, and so forth. Specifically, the holding time is preferably 1 to 12 hours and more preferably 2 to 8 hours. A firing atmosphere is not particularly limited. An atmosphere during hot pressing is generally an inert atmosphere, for example, nitrogen or argon. The rate of temperature increase and the rate of temperature decrease may be appropriately set in view of the form and the size of the formed body, the characteristics of the heating furnace, and so forth and, for example, may be set in the range of 50 to 300° C./h.

Figure 2:
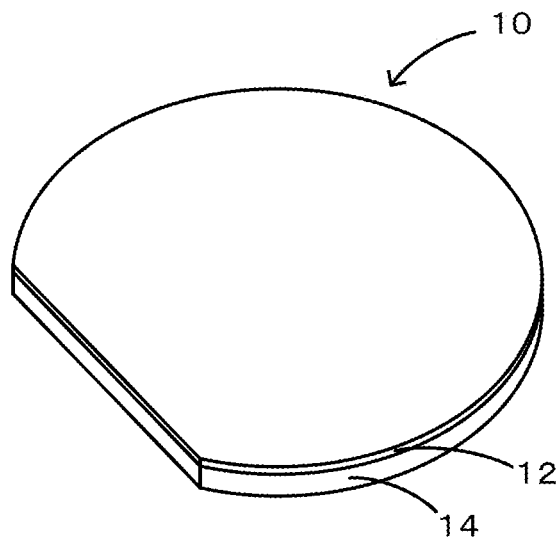
FIG. 2 is a perspective view of a composite substrate 10.

A composite substrate according to an embodiment of the present invention will be described below. The composite substrate of the present embodiment includes a functional substrate bonded to a support substrate composed of the cordierite-based sintered body. In this composite substrate, the high area percentage of the bonded portion between both substrates results in satisfactory bondability. Examples of the functional substrate include, but are not particularly limited to, lithium tantalate, lithium niobate, gallium nitride, and silicon. A bonding method is preferably a direct bonding. In the case of the direct bonding, after bonding surfaces of the functional substrate and the support substrate are polished and activated, both substrates are pressed together with both bonding surfaces facing together. The activation of the bonding surfaces is performed by, for example, the irradiation of the bonding surface with an ion beam of an inert gas (such as argon) or with a plasma or neutral atomic beam. The thickness ratio of the functional substrate to the support substrate (thickness of functional substrate/thickness of support substrate) is preferably 0.1 or less. FIG. 2 illustrates an example of a composite substrate. The composite substrate 10 is a substrate in which a piezoelectric substrate 12 serving as a functional substrate is bonded to a support substrate 14 by the direct bonding.

Figure 3:
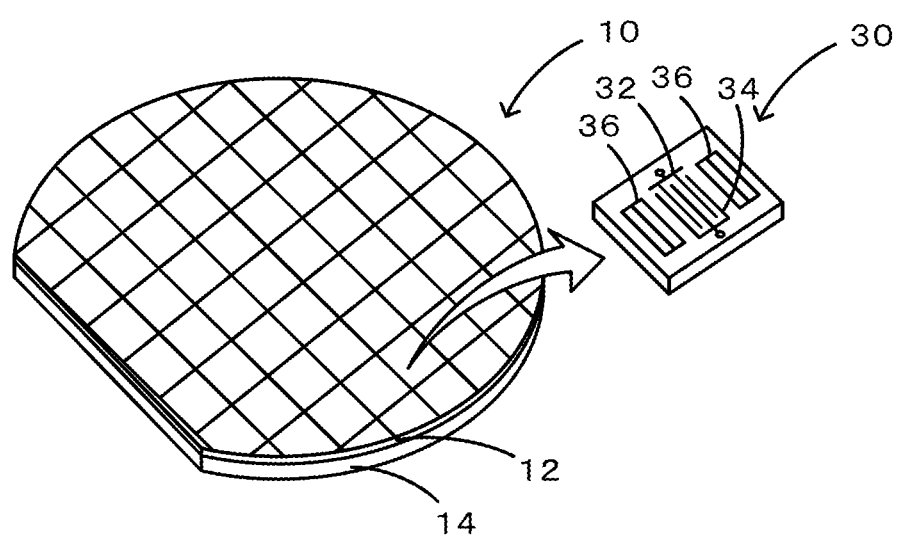
FIG. 3 is a perspective view of an electronic device 30 produced by the use of the composite substrate 10.

The composite substrate of the present embodiment is usable for electronic devices and so forth. Examples of electronic devices include acoustic wave devices (such as surface acoustic wave devices, Lamb wave devices, and film bulk acoustic resonators (FBARs)), LED devices, optical waveguide devices, and switching devices. When the foregoing composite substrate is used for an acoustic wave device, because the cordierite-based sintered body serving as a support substrate has a very small thermal expansion coefficient less than 2.4 ppm/° C. (40° C. to 400° C.), the dependence of frequency on temperature is significantly improved. FIG. 3 illustrates an example of the electronic device 30 produced by the use of the composite substrate 10. The electronic device 30 is a one-port SAW resonator, or a surface acoustic wave device. Many patterns each used for the electronic device 30 are formed on the piezoelectric substrate 12 of the composite substrate 10 by common photolithography technology and then cut into the individual electronic devices 30 by dicing. Each of the electronic devices 30 is a device in which interdigital transducer (IDT) electrodes 32 and 34 and reflector electrodes 36 are formed on a surface of the piezoelectric substrate 12 by photolithography technology.

It should be understood that the present invention is not limited to the foregoing embodiments, and various modifications can be made without departing from the technical scope of the present invention.

Examples

1. Preparation of Raw-Material Powder Mixture

A cordierite raw material was prepared from commercially available high-purity magnesia, alumina, and silica powders having an average particle diameter of 1 µm or less and a purity of 99.9% or more. Specifically, each of the powders were weighed and mixed so as to obtain the composition of cordierite. The mixture was heated to 1400° C. for 5 hours in an air atmosphere to form coarse cordierite particles. The resulting coarse cordierite particles were pulverized with a pot mill containing alumina serving as grinding media (diameter: 3 mm) and deionized water serving as a solvent for 70 hours to form a pulverized cordierite slurry having an average particle diameter of about 0.5 to 0.6 µm. The resulting slurry was dried in air at 110° C. The dry matter was passed through a sieve to provide a cordierite powder. The cordierite raw material and a silicon nitride raw material or a silicon carbide raw material were weighed so as to achieve the raw material composition of each of Experimental examples 1 to 9 in Table 1, and then mixed together using a pot mill containing alumina grinding media having a diameter of 5 mm. The resulting mixture was spray-dried to prepare a raw material powder mixture. As the silicon nitride raw material, a commercially available powder having an average particle diameter of 0.8 µm and a purity of 97% or more was used. As the silicon carbide raw material, a commercially available powder having an average particle diameter of 0.5 µm and a purity of 97% or more was used.

TABLE 1

| Experimental Example | Raw material composition | | | Condition of firing | | Evaluation of sintered body | | | | | |
|---|---|---|---|---|---|---|---|---|---|---|---|
| | | | | Firing | | | Sintered body composition | | | | |
| | Cordierite [vol. %] | Silicon nitride [vol. %] | Silicon carbide [vol. %] | temperature [° C.] | Pressing pressure [kgf/cm²] | Crystal phase | Cordierite [vol. %] | Silicon nitride [vol. %] | Silicon carbide [vol. %] | Bulk density [g/cm³] | Relative density [%] |
| 1 | 90 | 10 | — | 1375 | 200 | Cordierite Silicon nitride | 90 | 10 | — | 2.57 | 99.9 |
| 2 | 80 | 20 | — | 1375 | 200 | Cordierite Silicon nitride | 80 | 20 | — | 2.64 | 99.9 |
| 3 | 70 | 30 | — | 1375 | 200 | Cordierite Silicon nitride | 70 | 30 | — | 2.71 | 99.9 |
| 4 | 60 | 40 | — | 1375 | 200 | Cordierite Silicon nitride | 60 | 40 | — | 2.77 | 99.8 |
| 5 | 48 | 52 | — | 1375 | 200 | Cordierite Silicon nitride | 48 | 52 | — | 2.80 | 97.9 |
| 6 | 90 | — | 10 | 1425 | 200 | Cordierite Silicon carbide | 90 | — | 10 | 2.58 | 99.9 |
| 7 | 80 | — | 20 | 1425 | 200 | Cordierite Silicon carbide | 80 | — | 20 | 2.65 | 99.9 |
| 8 | 70 | — | 30 | 1425 | 200 | Cordierite Silicon carbide | 70 | — | 30 | 2.71 | 99.8 |
| 9 | 47 | — | 53 | 1425 | 200 | Cordierite Silicon carbide | 47 | — | 53 | 2.80 | 97.3 |
| 10 | 100 | 0 | — | 1425 | 200 | Cordierite | 100 | 0 | 0 | 2.50 | 100.0 |

| Experimental Example | Evaluation of sintered body | | | | | | | |
|---|---|---|---|---|---|---|---|---|
| | Open porosity [%] | Flexural strength [MPa] | Young's modulus [GPa] | Thermal expansion coefficient [ppm/K] | Number of pores [number] | Ra [nm] | Average grain size [µm] | Bondability |
| 1 | <0.1 | 220 | 160 | 1.4 | 0 | 0.5 | 0.61 | Best[1] |
| 2 | <0.1 | 250 | 170 | 1.5 | 0 | 0.7 | 0.55 | Best[1] |
| 3 | <0.1 | 330 | 190 | 1.7 | 0 | 0.8 | 0.57 | Best[1] |
| 4 | <0.1 | 350 | 210 | 1.8 | 0 | 1.1 | 0.54 | Good[1] |
| 5 | 0.6 | 250 | 220 | 2.0 | >50 | >5 | 0.58 | Poor[1] |
| 6 | <0.1 | 270 | 160 | 1.8 | 0 | 0.6 | 0.46 | Best[1] |
| 7 | <0.1 | 300 | 180 | 2 | 0 | 0.8 | 0.44 | Best[1] |
| 8 | <0.1 | 350 | 200 | 2.3 | 3 | 1.1 | 0.44 | Good[2] |
| 9 | 0.7 | 240 | 245 | 2.4 | >50 | >5 | 0.45 | Poor[1] |
| 10 | <0.1 | 200 | 140 | 1.1 | 0 | 0.6 | 0.48 | Best[1] |

[1]As the functional substrates, lithium tantalate (LT) substrates were used.
[2]As the functional substrates, lithium niobate (LN) substrates were used.

2. Production of Cordierite-Based Sintered Body

The raw material powder mixtures of Experimental examples 1 to 9 were each pressed at 50 kgf/cm² by uniaxial die pressing to form a green compact having a diameter of 100 mm and a thickness of about 25 mm. The green compact was placed in a graphite die and fired with a hot-pressing furnace at a firing temperature (maximum temperature) of 1375° C. to 1425° C. for 5 hours at a pressing pressure of 200 kgf/cm² to produce a cordierite-based sintered body. The firing temperature of each experimental example is listed in Table 1. The firing atmosphere was an argon atmosphere. The rate of temperature increase was 100° C./h. The rate of temperature decrease was 200° C./h. At 1200° C. or lower during cooling, furnace cooling was performed. In Experimental example 10, a compact was similarly formed from the cordierite powder alone and fired and fired with the hot-pressing furnace at a pressing pressure of 200 kgf/cm² and a firing temperature (maximum temperature) of 1425° C. for 5 hours to produce a sintered body composed of cordierite alone.

3. Evaluation of Properties

Test pieces (for example, 4×3×40 mm bending bars) were cut from the cordierite-based sintered bodies of Experimental examples 1 to 10 and subjected to evaluation tests. A surface of each of the about 4×3×10 mm test pieces was mirror-finished by polishing and used as a polished surface of a corresponding one of the sintered bodies. Polishing was performed as follows: lapping was performed with a diamond abrasive of 3 µm, a diamond abrasive of 0.5 µm, and as final finishing, a diamond abrasive of 0.1 µm or less. Properties that have been evaluated are described below.

(1) Crystal Phase

The sintered bodies were pulverized, and then the crystalline phases were identified with an X-ray diffractometer. Measurement conditions were as follows: CuKα radiation, 50 kV, 300 mA, and 2θ=5° to 70°. A rotating anode X-ray diffractometer (RINT, manufactured by Rigaku Corporation) was used.

(2) Composition of Sintered Body

Figure 4A:
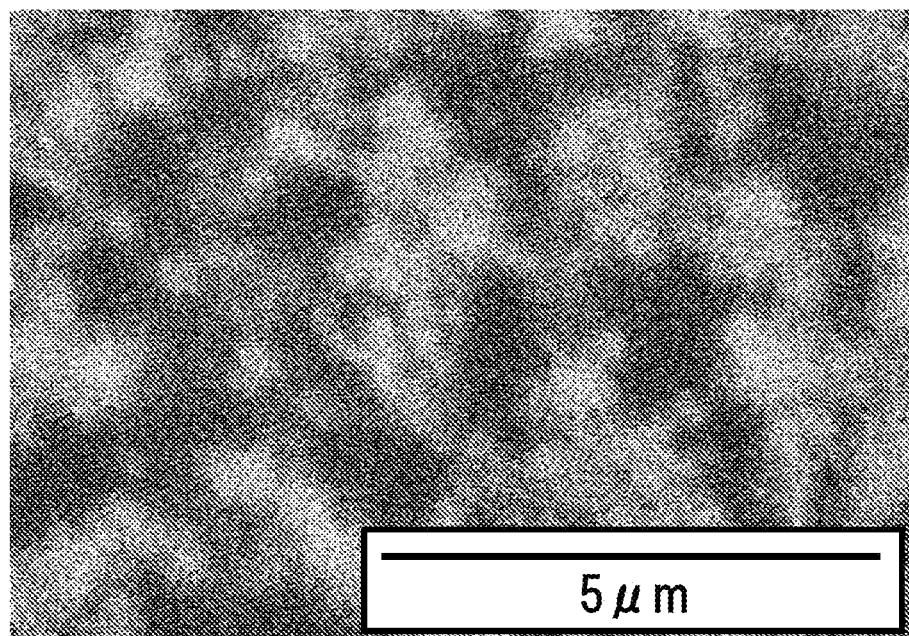
FIGS. 4A and 4B illustrate SEM images of a polished surface of a cordierite-based sintered body in Experimental example 3, FIG. 4A illustrating raw data, and FIG. 4B illustrating binarized data.
Figure 4B:
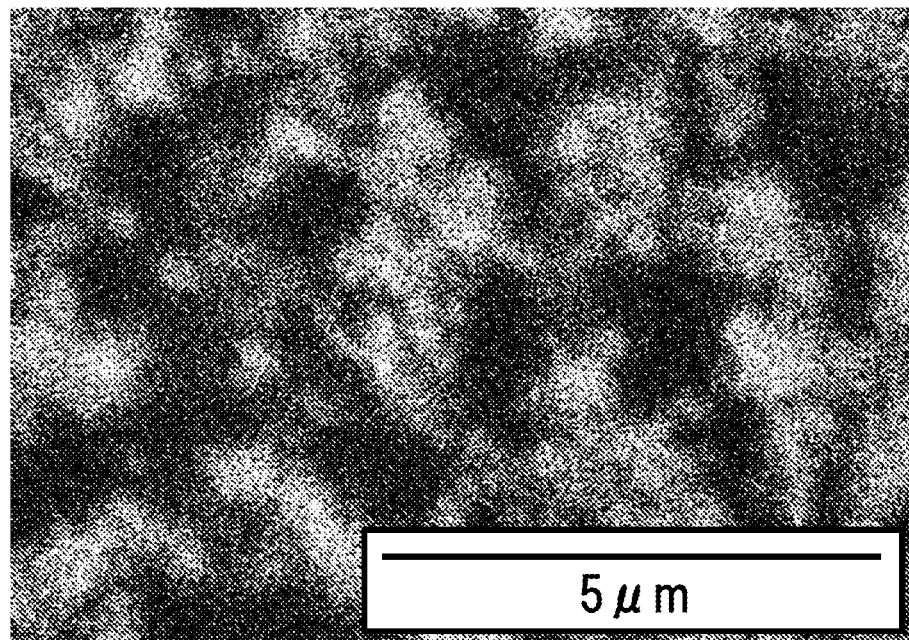

The polished surface of each of the sintered bodies finished as described above was subjected to observation of a backscattered electron image and a composition analysis with an SEM. The area ratio of a cordierite phase to another phase was determined from the contrast ratio of the image and converted to a volume ratio of the sintered body. Examples of SEM images of the polished surface are illustrated in FIGS. 4A and 4B. FIGS. 4A and 4B illustrate SEM images of the polished surface of the cordierite-based sintered body of Experimental example 3, FIG. 4A illustrating raw data, and FIG. 4B illustrating binarized data. In FIG. 4A, dark portions indicate the cordierite phase, and whitish portions indicate the silicon nitride phase.

(3) Bulk Density and Open Porosity

Bulk density and open porosity were measured with the bending bars by the Archimedes method with deionized water.

(4) Relative Density

The calculated density of each of the sintered bodies was calculated from the composition of the sintered body and the densities of the components, and the percentage of the bulk density measured as described above with respect to the calculated density was defined as a relative density. Here, the density of cordierite was 2.505 g/cm$^3$, the density of silicon nitride was 3.20 g/cm$^3$, and the density of silicon carbide was 3.21 g/cm$^3$. The densities of silicon nitride and silicon carbide used here are values obtained by neglecting the effect of impurity oxygen and so forth in the raw materials.

(5) Flexural Strength

Four-point flexural strength was measured in conformity with JIS 81601. Test pieces were 3 mm×4 mm×40 mm bending bars or bending bars of half the size thereof.

(6) Young's Modulus

The Young's modulus was measured by a static deflection method in conformity with JIS R1602. Test pieces were 3 mm×4 mm×40 mm bending bars.

(7) Thermal Expansion Coefficient (40° C. to 400° C.)

The thermal expansion coefficient was measured by using a push-rod differential type in conformity with JIS R1618. Test pieces had a size of 3 mm×4 mm×20 mm.

(8) Number of Pores

The polished surface of each of the sintered bodies that had been finished as described above was observed with an SEM to measure the number of pores having a maximum length of 1 μm or more in a 100 μm×100 μm area.

(9) Surface Flatness (Ra)

The center-line average roughness Ra of the polished surface of each of the sintered bodies that had been finished as described above was measured with an AFM. The measuring range was a 10 μm×10 μm area.

(10) Average Grain Size of Sintered Grain

The polished surface of each of the sintered bodies that had been finished as described above was thermally etched at 1200° C. to 1400° C. for 2 hours. The size of 200 or more grains of the sintered grains was measured with an SEM, and the average grain size thereof was calculated using linear analysis. The coefficient of the linear analysis was 1.5. A value obtained by multiplying the length actually measured with the SEM by 1.5 was defined as the average grain size.

(11) Bondability

Disks having a diameter of about 100 mm and a thickness of about 600 μm were cut from the sintered bodies of Experimental examples 1 to 10. The disks were subjected to polish finishing as described above and washed to remove particles and contaminants on their surfaces. Each of the disks was used as a support substrate, and the support substrate and a functional substrate were directly bonded to form a composite substrate. Specifically, the bonding surfaces of the support substrate and the functional substrate were activated with an argon ion beam. Then both bonding surfaces were allowed to face each other and press-bonded at 10 tonf to produce the composite substrate. As the functional substrates, lithium tantalate (LT) substrates and lithium niobate (LN) substrates were used. The bondability was evaluated from IR transmission images according to the following evaluation criteria: a composite substrate having a bonding area of 90% or more is rated "best", a composite substrate having a bonding area of 80% or more and less than 90% is rated "good", and a composite substrate having a bonding area less than 80% is rated "poor".

4. Evaluation Results

The cordierite-based sintered bodies of Experimental examples 1 to 9 contained silicon nitride or silicon carbide and thus had more improved flexural strength and Young's moduli than the sintered body composed of cordierite alone of Experimental example 10. Specifically, the Young's moduli were 160 GPa or more, and the four-point flexural strength was 220 MPa or more. The cordierite-based sintered bodies of Experimental examples 1 to 4 and 6 to 8 had a thermal expansion coefficient less than 2.4 ppm/° C. (1.4 to 1.8 ppm/° C. in Experimental examples 1 to 4 in which silicon nitride was added, and 1.8 to 2.3 ppm/° C. in Experimental examples 6 to 8 in which silicon carbide was added) at 40° C. to 400° C. Although the thermal expansion coefficients were slightly higher than that of the sintered body of cordierite alone of Experimental example 10, the thermal expansion coefficients were still maintained at low levels. The cordierite-based sintered bodies of Experimental examples 1 to 4 and 6 to 8 had an open porosity less than 0.1% and an average grain size of 1 μm or less, so that the polished surfaces had a small center-line average roughness Ra of 1.1 nm or less. Thus, the bondability when the disks cut from the cordierite-based sintered bodies of Experimental examples 1 to 3, 6, and 7 were directly bonded to the functional substrates was rated "best", in which the bonding area is 90% or more. The bondability when the disks cut from the cordierite-based sintered bodies of Experimental examples 4 and 8 were directly bonded to the functional substrates was rated "good", in which the bonding area is 80% or more and less than 90%. The fact that the number of pores was as small as three or less also contributes to the small center-line average roughness Ra of the polished surfaces. One reason for an average grain size of 1 μm or less in Experimental examples 1 to 9 is presumably that sintering was performed without using a sintering aid such as a rare-earth element oxide.

Experimental examples 1 to 4 and 6 to 8 correspond to examples of the present invention. Experimental examples 5, 9, and 10 correspond to comparative examples. The present invention is not limited to these experimental examples.

The present application claims priority from Japanese Patent Application No. 2016-058969, filed on Mar. 23, 2016 and Japanese Patent Application No. 2017-033437, filed on Feb. 24, 2017, the entire contents of which are incorporated herein by reference.

What is claimed is:

1. A composite substrate comprising, a piezoelectric substrate bonded to a cordierite-based sintered body support substrate, wherein the cordierite-based sintered body contains cordierite as a main component and silicon nitride, the cordierite-based sintered body having:

a thermal expansion coefficient less than 2.4 ppm/° C. at 40° C. to 400° C., an open porosity of 0.5% or less, and an average grain size of 0.61 µm or less, wherein the cordierite-based sintered body has a Young's modulus of 160 GPa or more, and wherein the cordierite-based sintered body contains silicon nitride and has a polished surface, and when the polished surface is subjected to observation of a backscattered electron image and a composition analysis with an SEM and then an area ratio of a cordierite phase to a silicon nitride phase is determined from a contrast ratio of the image and converted to a volume ratio of the sintered body, the cordierite phase is 60% to 90% by volume and the silicon nitride phase is 10% to 40% by volume;

wherein the polished surface has a center-line average roughness Ra of 1.5 nm or less; and wherein the polished surface is a surface to which the piezoelectric substrate is bonded.

2. The composite substrate according to claim 1, wherein the number of pores that have a maximum length of 1 µm or more and present in an area of 100 µm×100 µm of the polished surface is 10 or less.

3. The composite substrate according to claim 1, wherein the cordierite-based sintered body has a four-point flexural strength of 220 MPa or more.

4. A method for producing a composite substrate in which a piezoelectric substrate is bonded to a cordierite-based sintered body-comprising the steps of:

(a) preparing a raw-material powder mixture by mixing 60% to 90% by volume of a cordierite powder having an average particle diameter of 0.1 to 1 µm and 10% to 40% by volume of a silicon nitride powder having an average particle diameter of 0.1 to 1 µm in a total amount of 100% by; and (b) producing the cordierite-based sintered body by forming the raw material powder mixture into a compact having a predetermined form and subjecting the compact to hot pressing at a pressing pressure of 20 to 300 kgf/cm² and a firing temperature of 1350° C. to 1450° C., wherein the cordierite-based sintered body has a thermal expansion coefficient less than 2.4 ppm/° C. at 40° C. to 400° C., an open porosity of 0.5% or less, and an average grain size of 0.61 µm or less, and wherein the cordierite-based sintered body has a Young's modulus of 160 GPa or more, wherein the cordierite-based sintered body contains silicon nitride and has a polished surface, and when the polished surface is subjected to observation of a backscattered electron image and a composition analysis with an SEM and then an area ratio of a cordierite phase to a silicon nitride phase is determined from a contrast ratio of the image and converted to a volume ratio of the sintered body, the cordierite phase is 60% to 90% by volume and the silicon nitride phase is 10% to 40% by volume, wherein the polished surface has a center-line average roughness Ra of 1.5 nm or less, and wherein the polished surface is a surface to which the piezoelectric functional substrate is bonded.

5. The composite substrate according to claim 1, wherein the piezoelectric substrate is lithium tantalate or lithium niobate.

* * * * *